United States Patent
Hwang et al.

(10) Patent No.: US 9,809,455 B2
(45) Date of Patent: Nov. 7, 2017

(54) CONDUCTIVE MATERIAL AND ELECTRICAL DEVICE INCLUDING THE SAME

(71) Applicant: SAMSUNG ELECTRONICS CO., LTD., Suwon-si, Gyeonggi-do (KR)

(72) Inventors: Sung Woo Hwang, Seoul (KR); Kyoung-Seok Moon, Hwaseong-si (KR); Youngjin Cho, Suwon-si (KR); Yoon Chul Son, Hwaseong-si (KR); Kimoon Lee, Seoul (KR); Doh Won Jung, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 94 days.

(21) Appl. No.: 14/721,107

(22) Filed: May 26, 2015

(65) Prior Publication Data

US 2015/0344305 A1  Dec. 3, 2015

(30) Foreign Application Priority Data

May 27, 2014  (KR) .................. 10-2014-0064004

(51) Int. Cl.
*C01B 19/00* (2006.01)
*H01B 1/06* (2006.01)
(Continued)

(52) U.S. Cl.
CPC ............ *C01B 19/002* (2013.01); *C03C 17/22* (2013.01); *C22C 28/00* (2013.01); *C22C 30/00* (2013.01); *C30B 29/46* (2013.01); *H01B 1/06* (2013.01); *H01L 21/02491* (2013.01); *H01L 21/02502* (2013.01); *H01L 21/02505* (2013.01); *H01L 31/022466* (2013.01); *B22F 5/006* (2013.01); *B22F 2001/0033* (2013.01); (Continued)

(58) Field of Classification Search
None
See application file for complete search history.

(56) References Cited

U.S. PATENT DOCUMENTS 4,124,633 A    11/1978   Leonard et al.
5,458,865 A    10/1995   Novinson
(Continued)

FOREIGN PATENT DOCUMENTS

CN    101888974 A    11/2011
EP    0458353 A2    11/1991

OTHER PUBLICATIONS

Huang et al., "Metal dichalcogenide nanosheets: preparation, properties, and applications", Chem. Soc. Rev., published Jan. 23, 2013, 42, pp. 1934-1946, © The Royal Society of Chemistry 2013; accessible online within the www.resc.org/csr website; this document is attached as a PDF.*

(Continued)

*Primary Examiner* — Katie L Hammer
(74) *Attorney, Agent, or Firm* — Cantor Colburn LLP

(57) ABSTRACT

A conductive material including a first element selected from a transition metal, a platinum-group element, a rare earth element, and a combination thereof, a second element having an atomic radius which is 10 percent less than to 10 percent greater than an atomic radius of the first element, and a chalcogen element, wherein the conductive material has a layered crystal structure.

21 Claims, 9 Drawing Sheets

(51) Int. Cl.
- *H01L 21/02* (2006.01)
- *H01L 31/0224* (2006.01)
- *C30B 29/46* (2006.01)
- *C03C 17/22* (2006.01)
- *C22C 28/00* (2006.01)
- *C22C 30/00* (2006.01)
- *B22F 5/00* (2006.01)
- *B22F 1/00* (2006.01)

(52) U.S. Cl.
CPC ...... *C01P 2002/20* (2013.01); *C01P 2002/70* (2013.01); *C01P 2002/76* (2013.01); *C01P 2002/90* (2013.01); *C01P 2006/40* (2013.01); *C01P 2006/60* (2013.01); *C03C 2217/289* (2013.01)

(56) References Cited

U.S. PATENT DOCUMENTS

| | | |
|---|---|---|
| 6,271,297 B1 | 8/2001 | Ishida |
| 8,308,984 B2 | 11/2012 | Zhamu et al. |
| 8,329,138 B2 | 12/2012 | Tenne et al. |
| 8,518,364 B2 | 8/2013 | Tenne et al. |
| 9,496,067 B2 | 11/2016 | Tenne et al. |
| 2009/0311498 A1* | 12/2009 | Kiyomura ........... C23C 16/0272 428/218 |
| 2012/0021293 A1* | 1/2012 | Zhamu ................ C01B 31/0423 429/231.5 |
| 2012/0115312 A1* | 5/2012 | Agrawal ................ B82Y 30/00 438/478 |
| 2012/0329686 A1* | 12/2012 | Tenne .................... B82Y 30/00 508/150 |
| 2013/0000952 A1* | 1/2013 | Srinivas .................. H01B 1/02 174/126.1 |
| 2013/0001462 A1 | 1/2013 | Choi et al. |
| 2013/0316519 A1* | 11/2013 | Mitzi ............... H01L 21/02422 438/478 |
| 2015/0321916 A1* | 11/2015 | Coleman ............ C01B 21/0648 428/403 |

OTHER PUBLICATIONS

Li et al., "Ultrathin PtPdTe nanowires as Superior Catalysts for Methanol Electrooxidation", Angrew. Chem. Int. Ed., vol. 52, 2013, pp. 7472-7476.

The extended European Search Report dated Oct. 13, 2015.

Verma et al., "First principle electronic structure calculations of ternary alloys Hg1—xMnxTe in zinc-blende structure", Journal of Magnetism and Magnetic Materials, vol. 324, 2012, pp. 3017-3023.

* cited by examiner

CONDUCTIVE MATERIAL AND ELECTRICAL DEVICE INCLUDING THE SAME

CROSS REFERENCE TO RELATED APPLICATION

This application claims priority to and the benefit of Korean Patent Application No. 10-2014-0064004, filed in the Korean Intellectual Property Office on May 27, 2014, and all the benefits accruing therefrom under 35 U.S.C. §119, the entire content of which is incorporated herein by reference.

BACKGROUND

1. Field

A conductive material and an electronic device are disclosed.

2. Description of the Related Art

An electronic device such as a liquid crystal display (LCD), an organic light emitting diode device, and a touch screen panel includes a transparent conductor as a transparent electrode.

The transparent conductor may be broadly classified as three types according to the composition of the material. The first type is an organic-based transparent conductor, such as a conductive polymer, the second type is an oxide-based transparent conductor, such as indium tin oxide (ITO), and the third type is a metal-based transparent conductor such as a metal grid.

Conductive polymers have high specific resistance and low transparency and may be easily deteriorated when exposed to moisture and air. Indium tin oxide (ITO) may increase the manufacturing cost of a device due to the cost of indium, and ITO may limit a flexibility of a device. The metal-based transparent conductor may increase manufacturing cost due to the complicated manufacturing processes associated with use of a metal-based transparent conductor. Thus there remains a need for an improved conductive material suitable for electrical devices.

SUMMARY

An embodiment provides a flexible conductive material which is easily applied in a process, and provides high electrical conductivity and high light transmittance.

Another embodiment provides an electronic device including the conductive material.

According to an embodiment, a conductive material includes: a first element selected from a transition metal, a platinum-group element, a rare earth element, and a combination thereof; a second element having an atomic radius which is 10 percent less than to 10 percent greater than an atomic radius of the first element; and a chalcogen element, wherein the conductive material has a layered crystal structure.

The layered crystal structure may include a metal dichalcogenide layer including the first element and the chalcogen element, and the second element may be partially substituted in a position of the first element.

The second element may modify the layered crystal structure of the metal dichalcogenide.

The second element may be included in an amount of about 0.1 to about 20 mole percent, based on the total amount of the conductive material.

The conductive material may be represented by Chemical Formula 1.

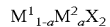     Chemical Formula 1

In the Chemical Formula 1, $M^1$ is the first element and may be selected from a transition metal, a platinum-group element, a rare earth element, and a combination thereof, $M^2$ is a second element and may have an atomic radius which is within ±10% of an atomic radius of the first element, X is sulfur (S), selenium (Se), tellurium (Te), or a combination thereof, and $0<a<0.5$.

In an embodiment a in Chemical Formula 1 may be $0.01 \leq a \leq 0.2$.

The layered crystal structure may include a plurality of unit crystal layers, and each unit crystal layer may include an upper layer and a lower layer, each including the chalcogen element, and the first element and the second element, each of which is disposed between the upper layer and the lower layer.

The second element may modify a lattice structure of the unit crystal layer.

The conductive material may have a conductivity of greater than or equal to about $3.0 \times 10^4$ S/cm.

The conductive material may have light transmittance of greater than or equal to about 80% at a wavelength of about 550 nm.

The conductive material may include a plurality of nanosheets having a thickness of less than or equal to about 200 nm, and the nanosheets may contact to each other to provide an electrical connection.

The conductive material may have exfoliation characteristics.

The conductive material may have a thickness of less than or equal to about 200 nm.

According to another embodiment, an electronic device includes the conductive material.

The electronic device may be a flat panel display, a touch screen panel, a solar cell, an e-window, a heat mirror, or a transparent transistor.

Also disclosed is a method of preparing a conductive material, the method including: heat treating a first element selected from a transition metal, a platinum-group element, a rare earth element, and a combination thereof, a second element having an atomic radius which is 10 percent less than to 10 percent greater than an atomic radius of the first element, and a chalcogen element to form a compound having a layered crystal structure; and exfoliating the compound having a layered crystal structure to prepare the conductive material.

BRIEF DESCRIPTION OF THE DRAWINGS

The above and other aspects, advantages and features of this disclosure will become more apparent by describing in further detail exemplary embodiments thereof with reference to the accompanying drawings, in which.

DETAILED DESCRIPTION

Figure 1:
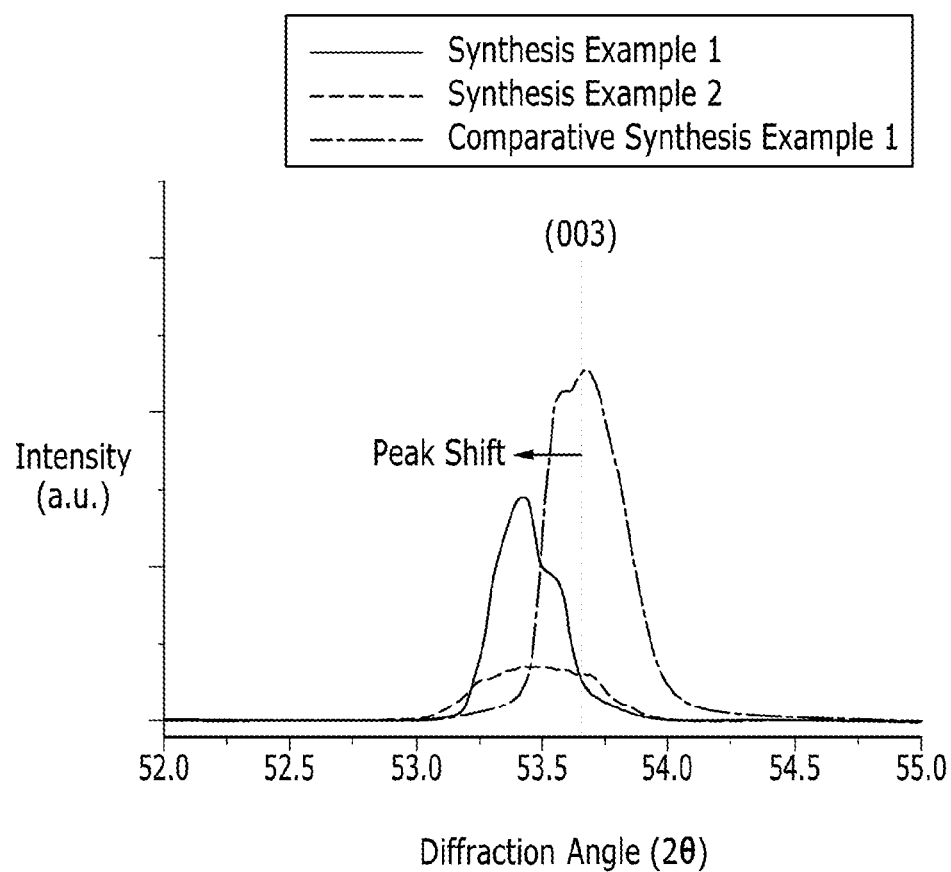
FIG. 1 is a graph of intensity (arbitrary units, a.u.) versus diffraction angle (degrees two-theta, 2θ) and is an XRD pattern of $Pd_{0.96}Pt_{0.04}Te_2$, $Pd_{0.92}Pt_{0.08}Te_2$, and $PdTe_2$ powders obtained from Synthesis Examples 1 and 2 and Comparative Synthesis Example 1, respectively.

Hereinafter, a conductive material is further described. However, the conductive material may be embodied in many different forms and shall not be construed as limited to the embodiments set forth herein.

"Transition metal" as defined herein refers to an element of Groups 3 to 11 of the Periodic Table of the Elements.

"Rare earth element" means the fifteen lanthanide elements, i.e., atomic numbers 57 to 71, plus scandium and yttrium.

The "lanthanide elements" means the chemical elements with atomic numbers 57 to 71.

A platinum-group element is an element selected from ruthenium, rhodium, palladium, osmium, iridium, platinum, and a combination thereof.

A chalcogen element is an element of Group 16 of the Periodic Table of the Elements, i.e., an element selected from O, S, Se, Te, Po, and a combination thereof.

Atomic radius as used herein refers to an empirically measured covalent radius for the element. See, for example, the radii reported in Slater, J. C., "Atomic Radii in Crystals," Journal of Chemical Physics, 41 (10): 3199-3205 (1964).

A conductive material comprises a first element selected from a transition metal, a platinum-group element, a rare earth element, or a combination thereof, a second element having an atomic radius which is 10 percent less than to 10 percent greater than, i.e., about within ±10 percent (%) of an atomic radius of the first element, and a chalcogen element.

The conductive material has a layered crystal structure, wherein the layered crystal structure is one in which layers are strongly bound and closely arranged between a plurality of the first elements, between a plurality of the second elements, between the first element and the second element, between the first element and the chalcogen element, between the second element and the chalcogen element, and/or between a plurality of the chalcogen elements, and then are parallelly overlapped by a weak binding force such as van der Waals force.

The layers of the layered crystal structure may slide on each other using the weak binding force between layers, so that the conductive material may be exfoliated along each layer or several hundred layers to provide a plurality of unit crystal layers having a unit of several nanometers to several hundred nanometers. While not wanting to be bound by theory, it is understood that the exfoliating properties of the conductive material make it possible to provide a conductive material with a suitable thickness by exfoliation and to easily perform a solution process, such as an inking process, to provide a suitable layer or film of the conductive material. In addition, and while not wanting to be bound by theory, it is understood that the exfoliating properties of the conductive material provide the desirable flexibility of the conductive material.

The layered crystal structure of the conductive material may be a modified metal dichalcogenide structure. The conductive material may have a hexagonal, rhombohedral, or monoclinic crystal structure. Representative space groups of the conductive material include C12/m1 (space group number 12), R3m (space group number 160), P$\bar{3}$2/m1 (space group number 164), and P $6_3$/m 2/m 2/c (space group number 194).

The metal dichalcogenide structure includes a plurality of unit crystal layers, and each of the unit crystal layers may have a structure including, for example, an upper layer and a lower layer, each of the upper layer and the lower layer consisting of the chalcogen element, wherein a first element is positioned between the upper layer and the lower layer.

A modified metal dichalcogenide structure may be obtained by doping a second element into the metal dichalcogenide structure. In the modified dichalcogenide structure, the second element may partially substitute for the first element. Also, the second element may reside in a position of the first element. In other words, the second element may be doped between the upper and the lower layers which include, for example, the chalcogen element. While not wanting to be bound by theory, it is understood that the presence of the second element in the layered crystal structure causes a structural stress, and as a result the lattice structure of the unit crystal layer may be deformed and have a structural strain between the layers.

While not wanting to be bound by theory, it is understood that inclusion of the second element results in a change to the interlayer distance in the conductive material. In an embodiment, inclusion of the second element provides an increase in a c axis dimension of about 0.1% to about 10%, about 0.5% to about 8%, or about 1% to about 6%, based on a total c axis dimension. In another embodiment, inclusion of the second element provides a decrease in a c axis dimension of about 0.1% to about 10%, about 0.5% to about 8%, or about 1% to about 6%, based on a total c axis dimension. In an embodiment, an absolute value of a change to the c axis dimension is about 0.1% to about 10%, about 0.5% to about 8%, or about 1% to about 6%, based on a total c axis dimension.

Thus the conductive material may comprise the modified metal dichalcogenide structure which comprises the second element. While not wanting to be bound by theory, it is understood that inclusion of the second element results in improved the physical properties, such as improved conductivity and the exfoliation characteristics. The physical properties, such as the conductivity characteristics and the exfoliation characteristics, may be controlled depending upon the type of the second element and the doping amount, and specifically, the conductivity and the exfoliation characteristics are understood to be a function of the degree of interlayer structural strain and the binding force between layers.

For example, the second element may be included in an amount of about 0.1 mole percent (mol %) to about 20 mol %, about 0.5 mol % to about 15 mol %, or about 1 mol % to about 10 mol %, based on the total amount of the conductive material. Within the range, the conductivity characteristics and the exfoliation characteristics of the conductive material may be further improved.

The first element may be selected from a transition metal, a platinum-group element, a rare earth element, and a combination thereof, and may be, for example, selected from nickel (Ni), platinum (Pt), palladium (Pd), titanium (Ti), vanadium (V), chromium (Cr), manganese (Mn), iron (Fe), cobalt (Co), copper (Cu), zirconium (Zr), niobium (Nb), molybdenum (Mo), technetium (Tc), silver (Ag), hafnium (Hf), tantalum (Ta), tungsten (W), rhenium (Re), gold (Au), iridium (Ir), osmium (Os), rhodium (Rh), ruthenium (Ru), lanthanum (La), cerium (Ce), scandium (Sc), yttrium (Y), praseodymium (Pr), neodymium (Nd), promethium (Pm), samarium (Sm), europium (Eu), gadolinium (Gd), dysprosium (Dy), holmium (Ho), erbium (Er), thulium (Tm), and ytterbium (Yb). An embodiment in which the first element is selected from Ce, Ni, Pt, and Pd is mentioned. In another embodiment, the first element is Pd.

The chalcogen element may be, for example, selected from sulfur (S), selenium (Se), tellurium (Te), and a combination thereof. An embodiment in which the chalcogen element is Te is mentioned.

The second element may be determined depending upon the first element, and may be selected from elements having an atomic radius which is about within ±10% of the atomic radius of the first element. In an embodiment, the second element has an atomic radius that is about −9% to about 9%, about −8% to about 8%, about −7% to about 7%, or about −6% to about 6% of the atomic radius of the first element. In an embodiment the first element has an atomic radius of about 130 picometers (pm) to about 195 pm, about 132 pm to about 190 pm, about 134 pm to about 185 pm, or about 136 to about 180 pm, and the second element has an atomic radius of about 115 picometers (pm) to about 215 pm, about 120 pm to about 210 pm, about 125 pm to about 205 pm, or about 130 to about 200 pm. Use of a first element having an atomic radius of about 140 pm and a second element having an atomic radius of about 130 pm to about 154 pm, or about 132 pm to about 153 pm is mentioned.

For example, when the first element is nickel (Ni), the second element may be, for example, magnesium (Mg), manganese (Mn), iron (Fe), cobalt (Co), copper (Cu), zinc (Zn), gallium (Ga), germanium (Ge), cadmium (Cd), indium (In), tin (Sn), antimony (Sb), thallium (Tl), lead (Pb), bismuth (Bi), or polonium (Po), but is not limited thereto.

For example, when the first element is palladium (Pd), the second element may be, for example, lithium (Li), scandium (Sc), titanium (Ti), vanadium (V), chromium (Cr), manganese (Mn), iron (Fe), cobalt (Co), technetium (Tc), ruthenium (Ru), rhodium (Rh), silver (Ag), cadmium (Cd), indium (In), osmium (Os), iridium (Ir), platinum (Pt), gold (Au), mercury (Hg), thallium (Tl), or lead (Pb), but is not limited thereto.

For example, when the first element is cerium (Ce), the second element may be, for example, lithium (Li), sodium (Na), calcium (Ca), scandium (Sc), titanium (Ti), vanadium (V), chromium (Cr), niobium (Nb), molybdenum (Mo), technetium (Tc), ruthenium (Ru), rhodium (Rh), palladium (Pd), tantalum (Ta), tungsten (W), rhenium (Re), osmium (Os), iridium (Ir), platinum (Pt), gold (Au), mercury (Hg), or lanthanum (La), but is not limited thereto.

Use of Pd as the first element and Pt or Mn as the second element is specifically mentioned.

The conductive material may be represented by, for example, Chemical Formula 1.

$$M^1_{1-a}M^2_aX_2 \qquad \text{Chemical Formula 1}$$

In Chemical Formula 1, $M^1$ is a first element selected from a transition metal, a platinum-group element, a rare earth element, and a combination thereof, $M^2$ is a second element having an atomic radius which is about ±10% of an atomic radius of the first element, X is a chalcogen element selected from sulfur (S), selenium (Se), tellurium (Te), and a combination thereof, and $0 < a < 0.5$.

The first element and the second element in Chemical Formula 1 may be the same as disclosed above.

In Chemical Formula 1, a refers to the degree of substitution with the second element, and for example, $0.01 \le a \le 0.2$, $0.02 \le a \le 0.19$, $0.04 \le a \le 0.18$, $0.06 \le a \le 0.17$, or $0.08 \le a \le 0.16$.

The conductive material may be applied to provide a conductor such as an electrode of an electronic device to improve electrical conductivity. In addition, the conductive material may provide suitable electrical conductivity and light transmittance for a transparent electrode of an electronic device.

The conductive material may have, for example, electrical conductivity of greater than or equal to about $1.0 \times 10^4$ Siemens per centimeter (S/cm), greater than or equal to about $2.0 \times 10^4$ S/cm, greater than or equal to about $3.0 \times 10^4$ S/cm, about $1.0 \times 10^4$ S/cm to about $9.0 \times 10^4$ S/cm, about $2.0 \times 10^4$ S/cm to about $8.0 \times 10^4$ S/cm, about $3.0 \times 10^4$ S/cm to about $7.0 \times 10^4$ S/cm, or about $4.0 \times 10^4$ S/cm to about $6.0 \times 10^4$ S/cm.

The conductive material may have light transmittance of greater than or equal to about 80% at a thickness of less than or equal to about 50 nm based on a wavelength of about 550 nm, for example, light transmittance of greater than or equal to about 85%, or about 80% to about 99%, about 85% to about 98%, or about 90% to about 97%, at a thickness of less than or equal to about 50 nm and based on a wavelength of about 550 nm.

Table 1 shows electrical conductivity (σ), specific resistance (ρ), an absorption coefficient (α), a product of the specific resistance (ρ) and the extinction coefficient (α), and sheet resistance (Rs) of $PdTe_2$ and a compound of Chemical Formula 1 wherein $M^1$ is Pd and $M^2$ is Pt.

TABLE 1

| | electrical conductivity (σ, S/cm) | specific resistance (ρ, Ω · cm) | absorption coefficient (α, cm$^{-1}$) | α * ρ (Ω/sq.) | sheet resistance (Rs, Ω/sq., T ≥ 90%) |
|---|---|---|---|---|---|
| PdTe$_2$ | 27,300 | 3.663 × 10$^{-5}$ | 158486 | 5.806 | 55.1 |
| PdTe$_2$:Pt (4 wt %) | 57,000 | 1.754 × 10$^{-5}$ | 158581.4 | 2.782 | 26.4 |

Table 1 shows that an electrical conductivity and an extinction coefficient calculated according to the following method and sequence, and sequentially a simulation process, and also sheet resistance calculated under transmittance of greater than or equal to about 90% when each compound is applied. The simulation program VASP and Boltztrap is used.

A band structure of a material is calculated through a first-principles electronic structure calculation.

Conductivity and plasma frequency are calculated by calculating intra-band transition by free electrons from the band structure.

Inter-band transition is calculated by bound electrons from the band structure.

A dielectric function is calculated by considering the free electrons and the bound electrons.

The square root of the dielectric function is taken to calculate a complex refractive function (n+ik), and then a refractive index for visible light and an absorption rate for the visible light are calculated from the refractive function.

The conductive material may be prepared as a transparent thin film by preparing a powder from, for example, a starting material, a polycrystalline or monocrystalline bulk material obtained therefrom, or a powder obtained from the bulk material, and disposing a transparent thin film from the starting material, the obtained bulk material, or the powder thereof according to deposition and the like.

The polycrystalline bulk material may be prepared from the starting material by using, for example, a quartz ampoule method, an arc melting method, a solid-state reaction method, or the like. The starting material may comprise, for example, the first element, the second element, and the chalcogen element, and may be in the form of a powder. For example, the quartz ampoule method may include disposing the starting material into a quartz tube or a metal ampoule, sealing the same under vacuum, and heating the same to effect a solid state reaction or a melting reaction. The arc melting method may include disposing the starting material into a chamber, arc discharging the same under the inert gas atmosphere, melting the starting material, and solidifying the same. The solid state reaction method may be performed by mixing the starting material to provide a pellet and heating the same, or mixing the starting material and heating the same to provide a pellet.

The obtained polycrystalline bulk material may be highly densified by sintering or the like. The highly densified material may be used as a specimen for measuring electrical conductivity. The high densification may be performed by a hot press method, a spark plasma sintering method, a hot forging method, or the like, but is not limited thereto. The hot press method is used to shape the material and may be performed by disposing the starting material into a mold having a predetermined shape and shaping at a high temperature of, for example, about 300° C. to about 800° C. under a high pressure of, for example, about 30 Pascals (Pa) to about 300 MPa. The spark plasma sintering method may include flowing a current of, for example, about 50 amperes (A) to about 500 A into the starting material under a pressure of, for example, about 30 MPa to about 300 MPa, and sintering the material within a short time. The hot forging method may include pressing and sintering the raw material at a high temperature of, for example, about 300° C. to about 700° C.

The monocrystalline bulk material may be obtained by providing crystalline ingots or growing single crystals.

The crystalline ingot may be obtained by heating the congruent melting material at a temperature of higher than the melting point and slowly cooling the same. For example, the starting materials may be mixed and disposed in a quartz ampoule, the quartz ampoule sealed under vacuum, the mixture melted to provide the conductive material, then the conductive material slowly cooled to provide a crystalline ingot of the conductive material. In this case, the size of crystals may be controlled by adjusting the cooling speed of the melted solution.

The monocrystalline growth may be performed by a metal flux method, a Bridgman method, an optical floating zone method, a vapor transport method, or the like.

The metal flux method may include introducing the mixture into a crucible and heat-treating the same at a high temperature under an atmosphere in which the starting material may be grown to provide crystals at a high temperature to grow the crystals. The Bridgman method may include introducing the starting material into a crucible, heating the starting material at a high temperature until the starting material is dissolved from the end of the crucible, slowly moving the high temperature zone and locally melting the sample, and passing the entire sample through the high temperature zone to grow the crystal. The optical floating zone method may include forming the starting material into a seed rod and a feed rod having a rod shape, focusing a heat source, e.g., a lamp, onto the feed rod, locally melting the sample at a high temperature, and slowly pulling up the melted portion to grow the crystal. The vapor transport method may include introducing the starting material into a bottom part of a quartz tube, and heating the starting material, and leaving the upper portion of the quartz tube at a low temperature to gasify the starting material causing a solid-phase reaction at a low temperature. The electrical conductivity of the obtained monocrystalline material may be measured by, for example, a DC 4 terminal method or a micro 4-point probe method.

The obtained monocrystalline or polycrystalline bulk material may be pulverized to provide crystalline powder. The pulverization may be performed by any suitable method such as ball milling, without specific limitation. After the pulverization, a powder having a uniform size may be provided, using, for example, a sieve.

The particles of the conductive material may have a dimension of about 5 nm to about 500 nm, from about 10 nm to about 450 nm, or from about 20 nm to about 400 nm. In an embodiment, the conductive material has a particle size, e.g., an average particle diameter as determined by light scattering, of about 5 nm to about 500 nm, from about 10 nm to about 450 nm, or from about 20 nm to about 400 nm. Also, the particles of the conductive material may have a thickness of about 1 nm to about 500 nm, from about 2 nm to about 250 nm, or from about 3 nm to about 125 nm.

The obtained polycrystalline or monocrystalline bulk material may be used as a target for vapor deposition to provide a thin film. The vapor deposition may be performed by, for example, physical vapor deposition such as thermal evaporation and sputtering, chemical vapor deposition, atomic layer deposition (ALD), or pulsed laser deposition. The deposition may be performed using any suitable device. The deposition conditions may be selected according to the properties of the compound and the characteristics of deposition method, are not particularly limited, and can be selected by one of skill in the art without undue experimentation.

Alternatively, the obtained polycrystalline or monocrystalline bulk material may be produced as a transparent thin film by preparing, for example, a plurality of nanosheets from the bulk material powder by liquid phase exfoliation and inking the obtained nanosheets.

The liquid phase exfoliation may be performed by ultrasonicating the bulk material or the powder obtained from the bulk material in an appropriate solvent.

The solvent may be selected from a carbonate, an ester, an ether, a ketone, an alcohol, an aldehyde, an acetate, and combinations thereof. The carbonate may be linear or cyclic, and may be fluorinated. Representative carbonates include diethyl carbonate, dimethyl carbonate, dipropyl carbonate, methyl propyl carbonate, ethyl propyl carbonate ("EPC"), and methyl ethyl carbonate. Representative cyclic carbonates include ethylene carbonate, propylene carbonate, butylene carbonate, vinyl ethylene carbonate, fluoroethylene carbonate, 4,5-difluoroethylene carbonate, 4,4-difluoroethylene carbonate, 4,4,5-trifluoroethylene carbonate, 4,4,5,5-tetrafluoroethylene carbonate, 4-fluoro-5-methylethylene carbonate, 4-fluoro-4-methylethylene carbonate, 4,5-difluoro-4-methyl ethylene carbonate, 4,4,5-trifluoro-5-methylethylene carbonate, and trifluoromethyl ethylene carbonate. Representative esters include methyl acetate, ethyl acetate, n-propyl acetate, dimethyl acetate, methyl propionate, ethyl propionate, γ-butyrolactone, decanolide, valerolactone, mevalonolactone, caprolactone, and methyl formate. Representative ethers include dibutyl ether, tetraglyme, diglyme, 1,2-dimethoxy ethane, 1,2-diethoxy ethane, ethoxy methoxy ethane, 2-methyl tetrahydrofuran, and tetrahydrofuran. Representative ketones include acetone, methyl ethyl ketone, β-bromoethyl isopropyl ketone, and cyclohexanone. Representative alcohols include methanol, ethanol, isopropanol, and butanol. The aldehyde my comprise acetaldehyde or propionaldehyde, for example. Representative acetates include ethylene glycol diacetate, n-hexyl acetate, and 2-ethylhexyl acetate. Alternatively, the solvent may comprise a nitrile, such as a C1 to C20 nitrile; an amide such as formamide or dimethyl formamide; a dioxolane such as 1,2-dioxolane or 1,3-dioxolane; a sulfoxide such as dimethyl sulfoxide; a sulfolane such as dimethyl sulfolane, sulfolane, or methyl sulfolane; 1,3-dimethyl-2-imidazolinone; N-methyl-2-pyrrolidinone; nitromethane; trimethyl phosphate; triethyl phosphate; trioctyl phosphate; or triester phosphate.

In an embodiment, the solvent may be selected from, for example, water, an alcohol (e.g., isopropanol, ethanol, or methanol), N-methylpyrrolidone (NMP), hexane, benzene, dichlorobenzene, toluene, chloroform, diethylether, dichloromethane (DCM), tetrahydrofuran (THF), ethylacetate, acetone, dimethylformamide (DMF), acetonitrile (MeCN), dimethyl sulfoxide (DMSO), ethylene carbonate, propylene carbonate, γ-butyrolactone, γ-valerolactone, a perfluorinated aromatic solvent, and a combination thereof, but is not limited thereto.

In an embodiment, a high boiling solvent is used. Suitable high boiling solvents may include mononitriles, such as valeronitrile, capronitrile, and benzonitrile; a glyme, such as diethylene glycol dimethyl ether (diglyme), or trimethylene glycol dimethyl ether (triglyme); and alcohol such as butanol; an aldehydes such as acetaldehyde or propionaldehyde, or N,N-dimethylformamide; a ketone such as β-bromoethyl isopropyl ketone; acetonitrile; a sulfoxide such as dimethylsulfoxide, diphenylsulfoxide, or ethyl phenyl sulfoxide; a sulfone such as diethyl sulfone or phenyl 7-quinolylsulfone; a thiophene such as thiophene 1-oxide; an acetate such as ethylene glycol diacetate, n-hexyl acetate, or 2-ethylhexyl acetate; an amides such as propanamide, or benzamide.

A combination comprising at least two of the foregoing solvents may be used.

In addition to the solvent, an additive such as a surfactant and a dispersing agent may be further included in order to facilitate the exfoliation and to prevent the aggregation of the exfoliated nanosheets.

The surfactants may be anionic, cationic, or nonionic surfactants having a hydrophilic head group and at least one oleophilic tail wherein the tails are selected from the group of hydrogen, alkyl, alkenyl, and alkynyl groups having about 4 to about 30 carbon atoms. Representative surfactants include quaternary ammonium, phosphonium, maleate, succinate, molecules having carboxyl containing groups, acrylate, benzylic hydrogens, benzylic halogens, aliphatic halogens, and oxazoline. Other representative surfactants include sodium lauryl sulfate and other alkyl sulfates; sodium dodecyl benzene sulfonate and other alkyl and aryl sulfonates; sodium stearate and other fatty acid salts; and polyvinyl alcohol and other non-ionic surfactants. When a combination of surfactants is used, the combination may include an anionic or a cationic surfactant, plus a non-ionic surfactant, or two or more anionic or cationic surfactants, or two or more non-ionic surfactants.

Representative dispersing agents include an alkylolammonium salt of a copolymer having acid groups, for example CAS No. 162627-23-8 (polyphosphoric acids, esters with 2-oxepanone-polyethylene glycol mono-methyl ether-tetrahydro-2H-pyran-2-one reaction product, compounds with 2-(dibutylamino)ethanol); an alkylammonium salt of a phosphoric acid ester of a copolymer; a copolymer containing phosphoric acid groups; a copolymer containing carboxylic acid groups; a polyester containing phosphoric acid groups; a poly(oxy(C1-C3)alkylene (C6-C32)) alkyl ether, for example CAS No. 9002-92-0 (poly(oxyethylene)(4)lauryl ether); and the like. Commercially available dispersants include DISPERBYK®-180, DISPERBYK®-145, DISPERBYK®-2163, and DISPERBYK®-110 (each available from BYK-Chemie GmbH, Wesel, Germany), and BRIJ 30 (available from Acros).

The surfactant and the dispersing agent may each independently be included in an amount of about 0.01 weight percent (wt %) to about 15 wt %, based on a total weight of the solvent.

The obtained nanosheets may be physically connected to provide an electrical connection. When the nanosheets are physically connected to provide a thin film, the light transmittance may be further enhanced. The nanosheet may be processed into a transparent thin film by, for example, dip coating, spray coating, slit coating, inkjet coating, and the like. The obtained transparent thin film may have coverage of greater than or equal to about 50%, or greater than or equal to about 70% within the range, or greater than or equal to about 90% within the range, and for example, the coverage may be about 100%, or about 50% to 100%, or about 60% to about 95%, based on a total area of a substrate on which the transparent thin film is formed.

The transparent thin film may have a thickness of about 1 nanometer (nm) to about 500 nm, from about 2 nm to about 250 nm, or from about 3 nm to about 125 nm.

In an embodiment, a thin film of the conductive material is transparent. The transparent thin film of the conductive material may have a thickness of, for example, less than or equal to about 200 nm. The thickness of the transparent thin film comprising the conductive material may range from about 5 nm to about 200 nm, from about 10 nm to 100 nm, from about 10 nm to about 80 nm, or from about 15 nm to about 60 nm. A light transmittance of a transparent thin film comprising the conductive material may be about 80% to about 99%, or about 85% to about 98%, or about 90% to about 97% for a film having a thickness of 50 nm for light having a wavelength of 550 nm. In an embodiment the transparent thin film comprises 80 weight percent (wt %) to 100 wt %, or 90 wt % to 99 wt % of the conductive material, based on a total weight of the transparent thin film. A thin film consisting of the conductive material is mentioned.

The conductive material may be applied to an electrode for various electronic devices. Examples of the electronic devices may include a flat panel display such as a liquid crystal display (LCD), an organic light emitting diode device, a touch panel screen, a solar cell, an e-window, a heat mirror, or a transparent transistor, but is not limited thereto.

In addition, as the conductive material has sufficient flexibility as described in above, it may be usefully applied to a flexible electronic device. The conductive material may have a Young's modulus, i.e., a tensile modulus, of about 0.01 gigapascals (GPa) to about 10 GPa, about 0.05 GPa to about 8 GPa, about 0.1 GPa to about 6 GPa, or about 0.5 GPa to about 4 GPa. Also the conductive material maintains its conductive properties after being flexed. For example a film of the conductive material, e.g., a 100 nm thick film of the conductive material on a polyethyleneterephthalate substrate, has a conductivity after bending 180° around a rod having a diameter 10 millimeters which is about 80% to 100%, about 85% to about 99%, or about 90% to about 98% of a conductivity before the bending when determined by a DC (constant current) four-probe method.

Hereinafter, as one example of the electronic device, an organic light emitting diode device in which the conductive material is applied to a transparent electrode is described with reference to the drawings.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Figure 9:
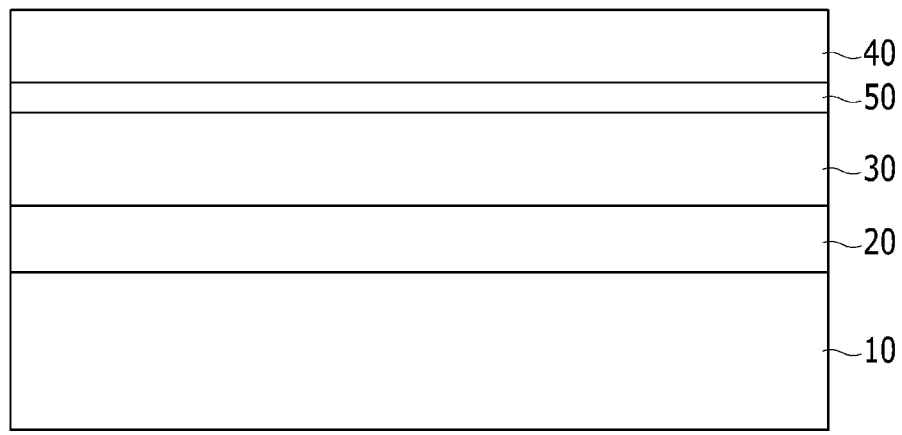
FIG. 9 is a schematic cross-sectional view showing an embodiment of an organic light emitting diode device.

FIG. 9 is a schematic cross-sectional view showing an organic light emitting diode device according to one embodiment.

Referring to FIG. 9, the organic light emitting diode device according to an embodiment includes a substrate 10, a lower electrode 20, an upper electrode 40 facing the lower electrode 20, and an emission layer 30 interposed between the lower electrode 20 and the upper electrode 40.

The substrate 10 may include, for example, an inorganic material such as glass, silicon, or an organic material such as a polymeric material selected from polycarbonate, polymethylmethacrylate, polyethylene terephthalate, polyethylene naphthalate, polyamide, and polyethersulfone. The combination comprising at least one of the foregoing substrates may be used.

One of the lower electrode 20 and the upper electrode 40 is a cathode, and the other is an anode. For example, the lower electrode 20 may be an anode, and the upper electrode 40 may be a cathode.

At least either one of the lower electrode 20 and the upper electrode 40 is transparent. When the lower electrode 20 is transparent, an organic light emitting diode device may have bottom emission in which light is emitted toward the substrate 10, while when the upper electrode 40 is transparent, the organic light emitting diode device may have top emission in which a light is emitted opposite the substrate 10. In addition, when the lower electrode 20 and upper electrode 40 are both transparent, light may be emitted both toward the substrate 10 and opposite the substrate 10.

The transparent electrode may comprise the conductive material as disclosed herein.

The emission layer 30 may comprise an organic material emitting a primary colors such as red, green, blue, and the like, or may comprise a mixture of an inorganic material and an organic material, for example, a polyfluorene compound, a (poly)paraphenylenevinylene compound, a polyphenylene compound, a polyfluorene compound, polyvinylcarbazole, a polythiophene compound, or a compound prepared by doping such polymer materials with a perylene-based pigment, a coumarin-based pigment, a rhodamine-based pigment, rubrene, perylene, 9,10-diphenylanthracene, tetraphenylbutadiene, Nile red, coumarin, quinacridone, and the like. An organic light emitting diode device displays a desirable image by a spatial combination of primary colors emitted by an emission layer therein.

The emission layer 30 may emit white light by combining three primary colors such as red, green, and blue. Specifically, the emission layer 30 may emit white light by combining colors of neighboring sub-pixels or by combining laminated colors in a vertical direction.

An auxiliary layer 50 may be positioned between the emission layer 30 and the upper electrode 40 to improve luminous efficiency. In the drawing, the auxiliary layer 50 is shown only between the emission layer 30 and the upper electrode 40 but is not limited thereto and may be positioned between the emission layer 30 and the lower electrode 20, or may be positioned between the emission layer 30 and the upper electrode 40, and between the emission layer 30 and the lower electrode 20.

The auxiliary layer 50 may include an electron transport layer (ETL) and a hole transport layer (HTL) for balancing between electrons and holes, an electron injection layer (EIL) and a hole injection layer (HIL) for reinforcing injection of electrons and holes, and the like. It may include one or more layers selected therefrom.

An embodiment in which the conductive material is applied to an organic light emitting diode device is described herein, but this disclosure is not limited thereto. The conductive material may be used for an electrode for all electronic devices including an electrode, for example, a pixel electrode and/or a common electrode of a liquid crystal display (LCD), a display electrode of a plasma display device, and a transparent electrode of a touch screen panel device.

Hereinafter, the embodiments are illustrated in more detail with reference to examples. These examples, however, are not in any sense to be interpreted as limiting the scope of this disclosure.

EXAMPLES

Synthesis Examples

Synthesis Example 1

2.7977 grams (g) (0.0263 moles (mol)) of Pd powder (purity: 99.99%, manufacturer: Heraeus), 0.2137 g (0.000109 mol) of Pt powder (purity: 99.99%, manufacturer: Heraeus), and 6.9886 g (0.05477 mol) of Te powder (purity: 99.99%, manufacturer: 5N Plus) are mixed in a glove box to provide a mixture. The mixture is introduced into a quartz glass tube and input into a box furnace and melted by heating to 1250° C., and then slowly cooled at a speed of about 2° C. per hour (° C./h) to grow a monocrystalline ingot.

The monocrystalline ingot is pulverized by a ball mill to provide $Pd_{0.96}Pt_{0.04}Te_2$ powder.

In addition, when the monocrystalline ingot is pulverized, it is confirmed that the crystalline surface is widely formed with relatively few defects, and then a mechanical exfoliation process is performed greater than or equal to 10 times using a 3M transparent tape to provide a $Pd_{0.96}Pt_{0.04}Te_2$ nanosheet.

The $Pd_{0.96}Pt_{0.04}Te_2$ powder is ultrasonicated in ethanol to provide a dispersion including $Pd_{0.96}Pt_{0.04}Te_2$ nanosheet. The obtained dispersion including $Pd_{0.96}Pt_{0.04}Te_2$ nanosheets are centrifuged, and the precipitates are washed with water and then centrifuged. The obtained nanosheet precipitate is input into a vial and added with 3 milliliters (mL) of deionized water and treated by ultrasonication. 2-3 mL of toluene is added thereto, and the vial is agitated to provide a thin film including $Pd_{0.96}Pt_{0.04}Te_2$ nanosheets on the interface between the aqueous layer and the toluene layer. A glass substrate treated with oxygen plasma is lightly dipped and taken out to prepare a $Pd_{0.96}Pt_{0.04}Te_2$ nanosheet formed on the glass substrate.

Synthesis Example 2

$Pd_{0.92}Pt_{0.08}Te_2$ powder and $Pd_{0.92}Pt_{0.08}Te_2$ nanosheets are prepared in accordance with the same procedure as in Synthesis Example 1, except that 2.6554 g (0.02496 mol) of Pd powder, 0.4233 g (0.0022 mol) of Pt powder, and 6.9214 g (0.0542 mol) of Te powder are used as starting materials.

Synthesis Example 3

$Pd_{0.96}Mn_{0.04}Te_2$ powder and $Pd_{0.96}Mn_{0.04}Te_2$ nanosheets are prepared in accordance with the same procedure as in Synthesis Example 1, except that 2.8413 g (0.0267 mol) of Pd powder, 0.061 g (0.0011 mol) of Mn powder (purity: 99.9%, manufacturer: Aldrich), and 7.0975 g (0.0556 mol) of Te powder are used as starting materials.

Synthesis Example 4

$Pd_{0.92}Mn_{0.08}Te_2$ powder and $Pd_{0.92}Mn_{0.08}Te_2$ nanosheets are prepared in accordance with the same procedure as in Synthesis Example 1, except that 2.7836 g (0.0257 mol) of Pd powder, 0.1229 g (0.0022 mol) of Mn powder (purity: 99.9%, manufacturer: Aldrich), and 7.1384 g (0.0559 mol) of Te powder are used as starting materials.

Comparative Synthesis Example 1

$PdTe_2$ powder and $PdTe_2$ nanosheets are prepared in accordance with the same procedure as in Synthesis Example 1, except that 2.9429 g (0.0277 mol) of Pd powder and 7.0571 g (0.0553 mol) of Te powder are used as starting materials without Pt powder.

Evaluation
Evaluation 1

In order to confirm the crystal structure of the powders obtained from Synthesis Examples 1 to 4 and Comparative Synthesis Example 1, X-ray diffraction (XRD) analysis is carried out.

Figure 2:
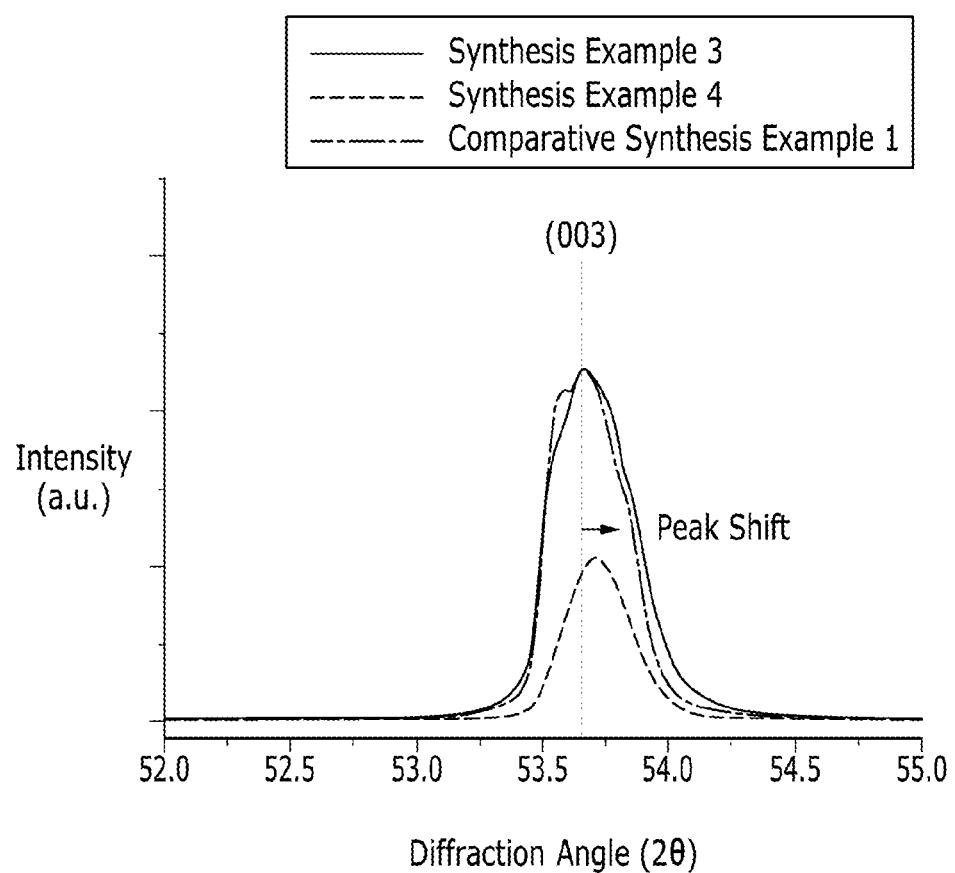
FIG. 2 is a graph of intensity (arbitrary units, a.u.) versus diffraction angle (degrees two-theta, 2θ) and is an XRD pattern of $Pd_{0.96}Mn_{0.04}Te_2$, $Pd_{0.92}Mn_{0.08}Te_2$, and $PdTe_2$ powders obtained from Synthesis Examples 3 and 4 and Comparative Synthesis Example 1, respectively.

FIG. 1 is a graph showing the results of XRD analysis of the $Pd_{0.96}Pt_{0.04}Te_2$, $Pd_{0.92}Pt_{0.08}Te_2$, and $PdTe_2$ powders obtained from Synthesis Examples 1 and 2 and Comparative Synthesis Example 1, and FIG. 2 is a graph showing the results of XRD analysis of the $Pd_{0.96}Mn_{0.04}Te_2$, $Pd_{0.92}Mn_{0.08}Te_2$, and $PdTe_2$ powders obtained from Synthesis Examples 3 and 4 and Comparative Synthesis Example 1.

Referring to FIG. 1, it is confirmed that the $Pd_{0.96}Pt_{0.04}Te_2$ and $Pd_{0.92}Pt_{0.08}Te_2$ powders obtained from Synthesis Examples 1 and 2 have (003) peaks which are shifted relative to the (003) peaks of the $PdTe_2$ powder obtained from Comparative Synthesis Example 1. From the XRD analysis, and while not wanting to be bound by theory, it is confirmed that the $Pd_{0.96}Pt_{0.04}Te_2$ and $Pd_{0.92}Pt_{0.08}Te_2$ powders obtained from Synthesis Examples 1 and 2 have a modified crystal structure compared to the $PdTe_2$ powder obtained from Comparative Synthesis Example 1, and the platinum included in the crystal structure provides an increased interlayer dimension of about 4% in a direction parallel to the c axis direction.

Referring to FIG. 2, it is confirmed that the $Pd_{0.96}Mn_{0.04}Te_2$ and $Pd_{0.92}Mn_{0.08}Te_2$ powders obtained from Synthesis Examples 3 and 4 have (003) peaks which are shifted relative to the (003) peaks of the $PdTe_2$ powder obtained from Comparative Synthesis Example 1. From the results, it is confirmed that the $Pd_{0.96}Mn_{0.04}Te_2$ and $Pd_{0.92}Mn_{0.08}Te_2$ powders obtained from Synthesis Examples 3 and 4 have a modified crystal structure compared to the $PdTe_2$ powder obtained from Comparative Synthesis Example 1, and the manganese included in the crystal structure provides a smaller interlayer dimension of about 1% in a direction parallel to the c axis direction.

Evaluation 2

The nanosheets obtained from Synthesis Examples 1 to 4 and Comparative Synthesis Example 1 are evaluated for electrical conductivity. The electrical conductivity is evaluated by physically attaching the nanosheets obtained from Synthesis Examples 1 to 4 and Comparative Synthesis Example 1 on a predetermined pattern-printed substrate to provide a specimen, and then measuring the conductivity according to a DC 4-point probe method at room temperature.

Figure 3:
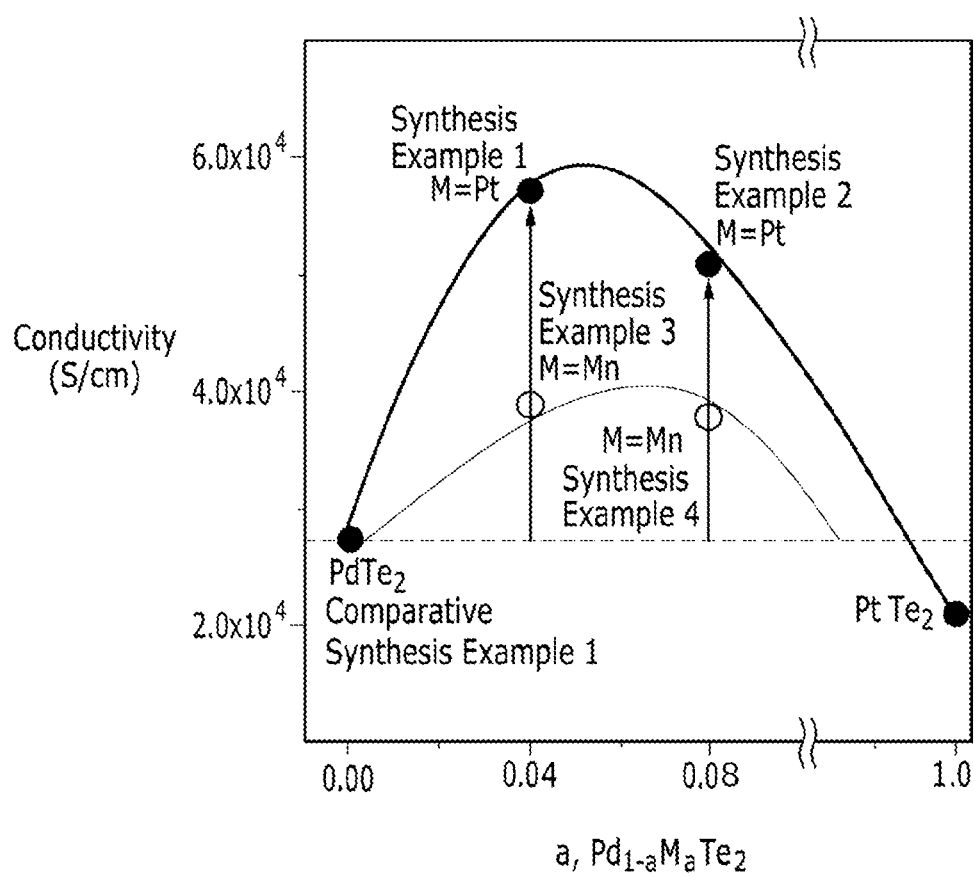
FIG. 3 is a graph of conductivity (Siemens per centimeter, S/cm) versus the stoichiometry of M in $Pd_{1-a}M_aTe_2$ showing an electrical conductivity of $Pd_{0.96}Pt_{0.04}Te_2$, $Pd_{0.92}Pt_{0.08}Te_2$, $Pd_{0.96}Mn_{0.04}Te_2$, $Pd_{0.92}Mn_{0.08}Te_2$, and $PdTe_2$ nanosheets obtained from Synthesis Examples 1 to 4 and Comparative Synthesis Example 1, respectively.

FIG. 3 is a graph showing the electrical conductivity of $Pd_{0.96}Pt_{0.04}Te_2$, $Pd_{0.92}Pt_{0.08}Te_2$, $Pd_{0.96}Mn_{0.04}Te_2$, $Pd_{0.92}Mn_{0.08}Te_2$, and $PdTe_2$ nanosheets obtained from Synthesis Examples 1 to 4 and Comparative Synthesis Example 1.

Referring to FIG. 3, it is confirmed that $Pd_{0.96}Pt_{0.04}Te_2$, $Pd_{0.92}Pt_{0.08}Te_2$, $Pd_{0.96}Mn_{0.04}Te_2$, and $Pd_{0.92}Mn_{0.08}Te_2$ nanosheets obtained from Synthesis Examples 1 to 4 have highly increased electrical conductivity compared to the $PdTe_2$ nanosheet obtained from Comparative Synthesis Example 1. Specifically, it is confirmed that all the $Pd_{0.96}Pt_{0.04}Te_2$, $Pd_{0.92}Pt_{0.08}Te_2$, $Pd_{0.96}Mn_{0.04}Te_2$, and $Pd_{0.92}Mn_{0.08}Te_2$ nanosheets obtained from Synthesis Examples 1 to 4 have electrical conductivity of greater than or equal to about $3.0 \times 10^4$ S/cm.

Evaluation 3

The nanosheets obtained from Synthesis Examples 1 to 4 and Comparative Synthesis Example 1 are measured for thickness using atomic force microscopy.

Figure 4:
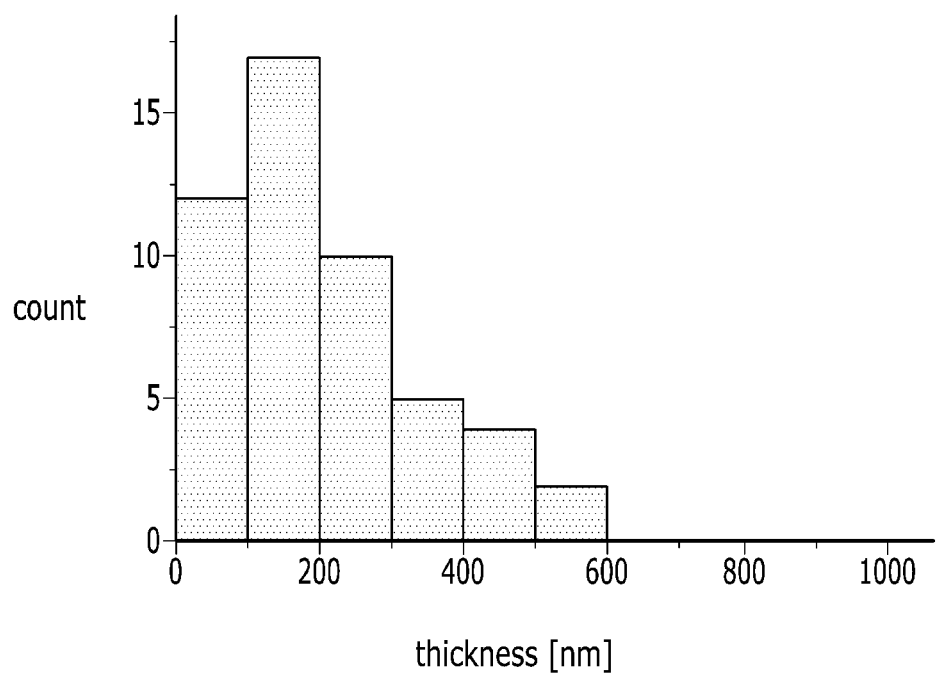
FIG. 4 is a histogram of counts versus nanosheet thickness (nanometers, nm) showing a thickness of $Pd_{0.96}Pt_{0.04}Te_2$ nanosheets obtained from Synthesis Example 1.
Figure 5:
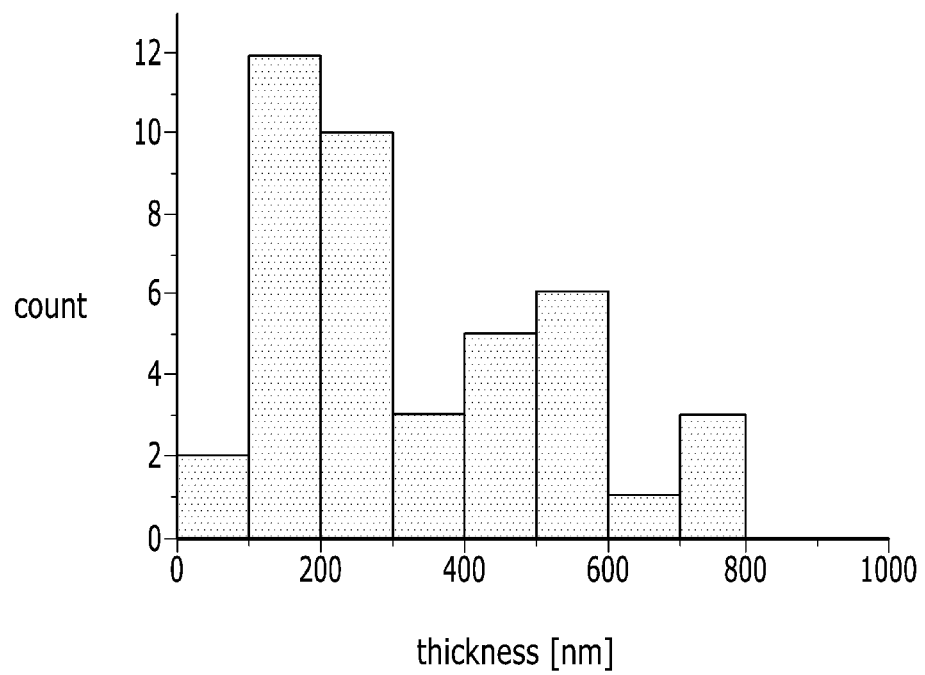
FIG. 5 is a histogram of counts versus nanosheet thickness (nanometers, nm) showing a thickness of $Pd_{0.92}Pt_{0.08}Te_2$ nanosheets obtained from Synthesis Example 2.
Figure 6:
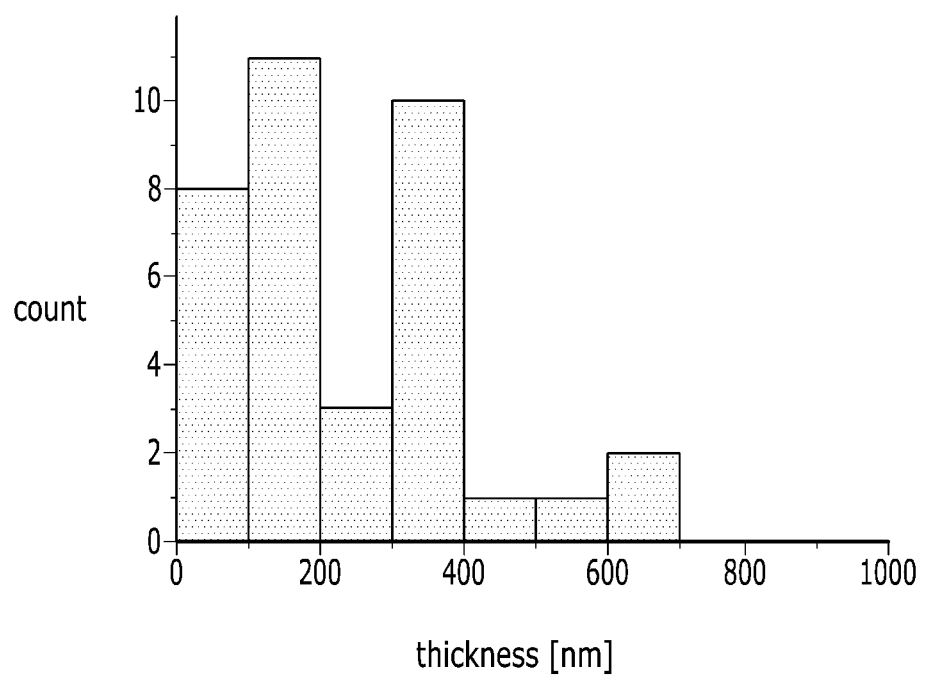
FIG. 6 is a histogram of counts versus nanosheet thickness (nanometers, nm) showing a thickness of $Pd_{0.96}Mn_{0.04}Te_2$ nanosheets obtained from Synthesis Example 3.
Figure 7:
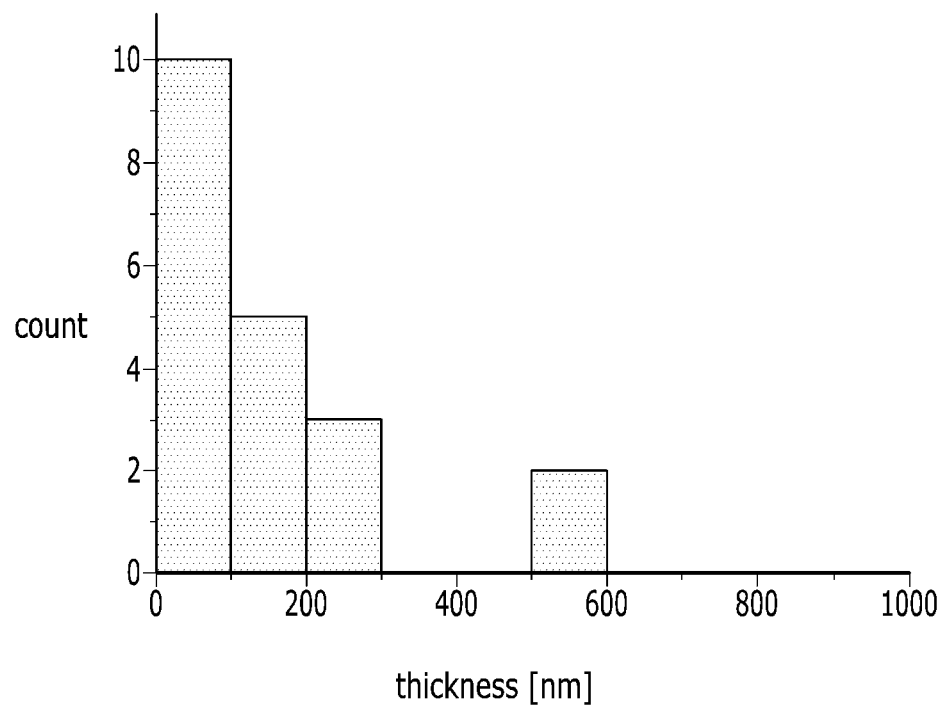
FIG. 7 is a histogram of counts versus nanosheet thickness (nanometers, nm) showing a thickness of $Pd_{0.92}Mn_{0.08}Te_2$ nanosheets obtained from Synthesis Example 4.
Figure 8:
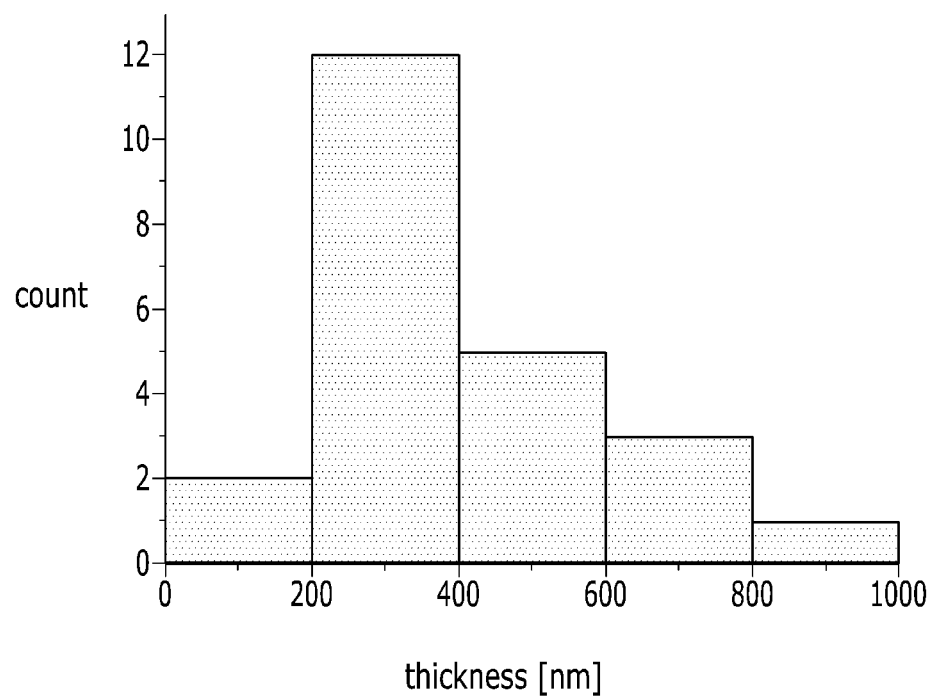
FIG. 8 is a histogram of counts versus nanosheet thickness (nanometers, nm) showing a thickness of $PdTe_2$ nanosheets obtained from Comparative Synthesis Example 1.

FIG. 4 is a graph showing a thickness of $Pd_{0.96}Pt_{0.04}Te_2$ nanosheets obtained from Synthesis Example 1, FIG. 5 is a graph showing a thickness of $Pd_{0.92}Pt_{0.08}Te_2$ nanosheets obtained from Synthesis Example 2, FIG. 6 is a graph showing a thickness of $Pd_{0.96}Mn_{0.04}Te_2$ nanosheets obtained from Synthesis Example 3; FIG. 7 is a graph showing a thickness of $Pd_{0.92}Mn_{0.08}Te_2$ nanosheets obtained from Synthesis Example 4; and FIG. 8 is a graph showing a thickness of $PdTe_2$ nanosheets obtained from Comparative Synthesis Example 1.

Referring to FIG. 4 to FIG. 8, it is confirmed that the $Pd_{0.96}Pt_{0.04}Te_2$, $Pd_{0.92}Pt_{0.08}Te_2$, $Pd_{0.96}Mn_{0.04}Te_2$, and $Pd_{0.92}Mn_{0.08}Te_2$ nanosheets obtained from Synthesis Examples 1 to 4 comprise primarily nanosheets having a thickness of less than about 200 nm; whereas the $PdTe_2$ nanosheets obtained from Comparative Synthesis Example 1 contain few nanosheets having a thickness of less than about 200 nm and primarily have nanosheets with a thickness of about 200 nm to about 400 nm.

From these results, it is confirmed that the $Pd_{0.96}Pt_{0.04}Te_2$, $Pd_{0.92}Pt_{0.08}Te_2$, $Pd_{0.96}Mn_{0.04}Te_2$, and $Pd_{0.92}Mn_{0.08}Te_2$ nanosheets obtained from Synthesis Examples 1 to 4 have a thickness of less than or equal to about 50% of the thickness of the $PdTe_2$ nanosheets obtained from Comparative Synthesis Example 1. From these results, it is confirmed that the disclosed conductive material provides improved exfoliation characteristics.

While this disclosure has been described in connection with what is presently considered to be practical embodiments, it is to be understood that the invention is not limited to the disclosed embodiments, but, on the contrary, is intended to include various modifications and equivalent arrangements included within the spirit and scope of the appended claims.

What is claimed is:

1. A conductive material, comprising:
 a first element selected from a transition metal, a platinum-group element, a rare earth element, and a combination thereof;
 a second element having an atomic radius which is 10 percent less than to 10 percent greater than an atomic radius of the first element; and
 a chalcogen element,
 wherein the conductive material has a layered crystal structure,
 wherein an electrical conductivity of the conductive material is greater than or equal to about $3.0\times10^4$ Siemens per centimeter.

2. The conductive material of claim 1, wherein the layered crystal structure comprises a metal dichalcogenide layer comprising the first element and the chalcogen element, and
 wherein the second element is partially substituted at a position of the first element.

3. The conductive material of claim 2, wherein the second element is disposed between adjacent metal dichalcogenide layers.

4. The conductive material of claim 2, wherein the layered crystal structure of the conductive material has a c axis dimension which is about 0.1% to about 10% greater than or about 0.1% to about 10% less than a c axis dimension of a metal dichalcogenide consisting of the first element and the chalcogen element.

5. The conductive material of claim 1, wherein the second element is included in an amount of about 0.1 to about 20 mole percent, based on a total amount of the conductive material.

6. The conductive material of claim 1, wherein the conductive material is represented by Chemical Formula 1:

$$M^1_{1-a}M^2_aX_2 \qquad \text{Chemical Formula 1}$$

wherein, in Chemical Formula 1,
 $M^1$ is the first element,
 $M^2$ is the second element,
 X is the chalcogen element, and
 $0<a<0.5$.

7. The conductive material of claim 6, wherein a in Chemical Formula 1 is $0.01\le a\le 0.2$.

8. The conductive material of claim 1, wherein the layered crystal structure comprises a plurality of unit crystal layers, wherein each unit crystal layer comprises:
 an upper layer and a lower layer, each comprising the chalcogen element, and
 the first element and the second element, each disposed between the upper layer and the lower layer.

9. The conductive material of claim 8, wherein conductive material has a c axis dimension which is about 0.1% to about 10% greater than or about 0.1% to about 10% less than a c axis dimension of a metal dichalcogenide consisting of the first element and the chalcogen element.

10. The conductive material of claim 1, wherein a light transmittance of the conductive material is greater than or equal to about 80 percent at a wavelength of 550 nanometers for a thickness of less than or equal to about 50 nm.

11. The conductive material of claim 1, wherein the conductive material comprises a plurality of nanosheets having a thickness of less than or equal to about 200 nm, and
 wherein the nanosheets contact to each other to provide an electrical connection.

12. The conductive material of claim 1, wherein the conductive material has a thickness of about 1 nanometer to about 500 nanometers.

13. The conductive material of claim 12, wherein the conductive material has a Young's modulus of about 0.01 gigapascals to about 10 gigapascals.

14. A transparent film comprising the conductive material of claim 12, wherein the transparent film has a thickness of less than or equal to about 200 nm.

15. The transparent film of claim 14, wherein the transparent film has a Young's modulus of about 0.01 gigapascals to about 10 gigapascals.

16. An electronic device comprising the conductive material of claim 1.

17. An electronic device comprising the transparent film of claim 14.

18. The electronic device of claim 17, wherein the electronic device is a flat panel display, a touch screen panel, a solar cell, an e-window, a heat mirror, or a transparent transistor.

19. A method of preparing a conductive material, the method comprising:
 heat treating
 a first element selected from a transition metal, a platinum-group element, a rare earth element, and a combination thereof,
 a second element having an atomic radius which is 10 percent less than to 10 percent greater than an atomic radius of the first element, and
 a chalcogen element to form a compound having a layered crystal structure; and
 exfoliating the compound having a layered crystal structure to prepare the conductive material,
 wherein an electrical conductivity of the conductive material is greater than or equal to about $3.0\times10^4$ Siemens per centimeter.

20. The method of claim 19, wherein the exfoliating comprises ultrasonication.

21. The method of claim 19, wherein the method further comprises disposing the conductive material on a substrate to manufacture a transparent film.

* * * * *